United States Patent

Széchényi

[11] 3,987,381
[45] Oct. 19, 1976

[54] ELECTRONIC CONTROLLABLE NEGATIVE RESISTANCE ARRANGEMENT

[75] Inventor: Kalman Széchényi, Stuttgart, Germany

[73] Assignee: International Standard Electric Corporation, New York, N.Y.

[22] Filed: Apr. 15, 1975

[21] Appl. No.: 568,343

[30] Foreign Application Priority Data
Apr. 22, 1974  Germany............................ 2419335

[52] U.S. Cl.............................. 333/80 R; 307/230
[51] Int. Cl.² ........................................ H03H 5/00
[58] Field of Search............ 330/107; 333/1.1, 80 R, 333/80 T; 307/230; 323/7, 63, 74

[56] References Cited
UNITED STATES PATENTS
3,501,716  3/1970  Ferch et al......................... 333/80 R
3,582,803  6/1971  Greenaway et al.............. 333/1.1 X

*Primary Examiner*—Paul L. Gensler
*Attorney, Agent, or Firm*—John T. O'Halloran; Thomas M. Marshall

[57] ABSTRACT

An electronic resistance arrangement having symmetrical structure and properties comprises four series-connected negative-resistance elements having negative feedback operational amplifiers. A measuring current can be fed to the center of the arrangement whereby both halves of the arrangement can be independently controlled for compensating a resistance.

1 Claim, 1 Drawing Figure

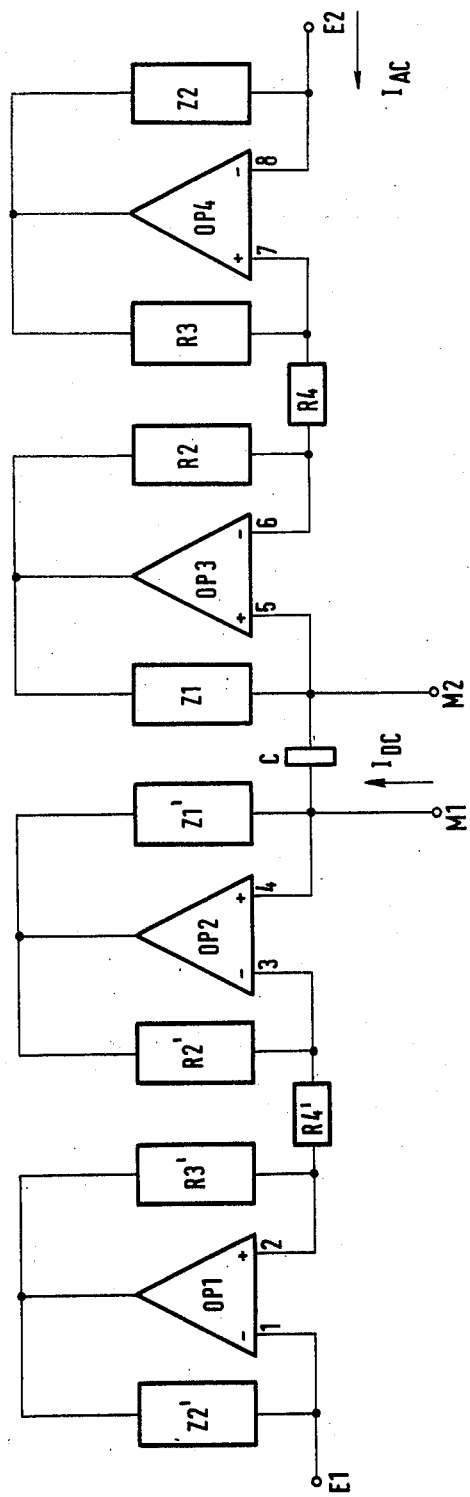

ELECTRONIC CONTROLLABLE NEGATIVE RESISTANCE ARRANGEMENT

FIELD OF THE INVENTION

The present invention relates to an electronic negative resistance.

BACKGROUND OF THE INVENTION

Negative resistances are used to compensate for line losses, such as impedance converters, as described in "Der Transistor" by J. Dosse, Oldenbourg Verlag 1959, p. 220. A negative resistance can be implemented with a negative-feedback operational amplifier whose output is connected via resistors to its two inputs. The terminals of the negative resistance are the two inputs of the operational amplifier.

This type of circuit normally has an unsymmetrical structure and unsymmetrical properties. It is open-circuit stable as seen from the inverting input of the operational amplifier, and short-circuit stable as seen from the non-inverting input.

In some applications these asymmetries are undesirable, such as for the compensation of a resistance in both directions in a symmetrical arrangement.

SUMMARY OF THE INVENTION

The object of the invention is to provide an electronic resistance with both completely symmetrical structure and symmetrical properties. The invention is characterized in that four operational amplifiers are connected in series with respect to their inputs so that the output of each operational amplifier is connected via two resistors to its two inputs and the total of the eight inputs of the four operational amplifiers are interconnected as follows:

the inverting input of the first operational amplifier represents a first terminal of a terminal pair of the electronic resistance;

the non-inverting input of the first operational amplifier is connected via a first resistor to the inverting input of the second operational amplifier;

the non-inverting input of the second operational amplifier and the non-inverting input of the third operational amplifier are interconnected via an isolating capacitor and represent two test terminals of the electronic resistance;

the inverting input of the third operational amplifier is connected via a second resistor to the non-inverting input of the fourth operational amplifier; and the inverting input of the fourth operational amplifier represents a second terminal of the terminal pair of the electronic resistance.

BRIEF DESCRIPTION OF THE DRAWING

The FIGURE is a schematic representation of the circuit of this invention.

DESCRIPTION OF THE PREFERRED EMBODIMENT

The electronic resistance consists of four negative-feedback operational amplifiers OP1...OP4. The operational amplifiers OP1 and OP2 are connected together via a resistor R4', the operational amplifiers OP3 and OP4 via a resistor R4, and the operational amplifiers OP2 and OP3 via an isolating capacitor C. The circuit arrangement has two pairs of terminals E1, E2 and M1, M2. The terminals E1 or E2 serve to feed in a current $I_{AC}$ which, looking in from both terminals, sees a negative resultant resistance $$R_{AC} = -(R4 \cdot \frac{Z2}{R3} + R4' \cdot \frac{Z2'}{R3'}).$$

The terminals E1 and E2 represent two open-circuit-stable ends of the electronic resistance according to the invention — a property which is not achieved with known arrangements.

The terminals M1 and M2 serve, either individually or in combination, to feed in a current $I_{DC}$ which flows through one half of the arrangement (OP2 and OP1 or OP3 and OP4), e.g. for measuring purposes. The two terminals M1 and M2 represent the short-circuit-stable ends of the two halves.

The resultant negative resistances of the operational amplifiers OP1 and OP4 are converted by the operational amplifiers OP2 and OP3 to a positive resistance, i.e., a current $I_{DC}$ sees a resultant positive resistance in the respective half. Using the current $I_{DC}$ as a measuring current, it is possible to control both halves of the circuit arrangement according to the invention independently of one another and thus vary the resultant resistance $R_{AC}$. The total of the properties of the electronic resistance according to the invention thus permits many uses in all fields where controllable negative resistances are needed.

While I have described above the principles of my invention in connection with specific apparatus it is to be clearly understood that this description is made only by way of example and not as a limitation to the scope of my invention as set forth in the objects thereof and in the accompanying claims.

What is claimed is:

1. An electronic controllable negative resistance arrangement having both symmetrical structure and properties comprising:

a first, second, third and fourth operational amplifier serially connected with respect to their inputs so that the output of each of said amplifiers is connected to each of its said inputs by at least one resistor, each of said inputs being electrically interconnected as follows:

the inverting input of said first operational amplifier forming a first terminal of a pair of terminals for said negative resistance arrangement, the non-inverting input of said first operational amplifier connected to the inverting input of said second operational amplifier by means of a first resistor, the non-inverting input of said second operational amplifier connected to the non-inverting input of said third operational amplifier through an isolating capacitor, said non-inverting input of said second operational amplifier and said non-inverting input of said third operational amplifier providing a pair of measurement terminals for said arrangement, the inverting input of said third operational amplifier connected with the non-inverting input of said fourth operational amplifier by means of a second resistor, and said inverting input of said fourth operational amplifier providing the second terminal of said pair of terminals of said arrangement.

* * * * *